United States Patent [19]
Maccarrone et al.

[11] Patent Number: 5,822,259
[45] Date of Patent: Oct. 13, 1998

[54] UPROM CELL FOR LOW VOLTAGE SUPPLY

[75] Inventors: Marco Maccarrone, Palestro; Stefano Ghezzi, Treviolo; Maurizio Branchetti, Via Della Costituzione, all of Italy

[73] Assignee: SGS-Thomson Microelectronics S.r.l., Milan, Italy

[21] Appl. No.: 846,755

[22] Filed: Apr. 30, 1997

[30] Foreign Application Priority Data

Apr. 30, 1996 [EP] European Pat. Off. .............. 96830243

[51] Int. Cl.$^6$ .................................................. G11C 7/00
[52] U.S. Cl. ................ 365/203; 365/189.05; 365/189.07
[58] Field of Search .............................. 365/203, 189.05, 365/189.07, 154, 156

[56] References Cited

U.S. PATENT DOCUMENTS

| | | | |
|---|---|---|---|
| 5,357,458 | 10/1994 | Yu et al. ................................... | 365/49 |
| 5,592,416 | 1/1997 | Bonitz et al. ....................... | 365/185.07 |
| 5,606,523 | 2/1997 | Mirabel .............................. | 365/185.05 |
| 5,671,186 | 9/1997 | Igura ....................................... | 365/203 |

FOREIGN PATENT DOCUMENTS

| | | | |
|---|---|---|---|
| 0319066 A2 | 6/1989 | European Pat. Off. | ........ G11C 17/00 |
| 0698889 A1 | 2/1996 | European Pat. Off. | ........ G11C 16/06 |

*Primary Examiner*—Vu A. Le
*Attorney, Agent, or Firm*—Allen, Dyer, Doppelt, Milbrath & Gilchrist, P.A.

[57] ABSTRACT

The present invention is directed to a redundant UPROM cell incorporating at least one memory element of the EPROM or flash type having a control terminal and a conduction terminal to be biased, a register with inverters connected to the memory element, and MOS transistors connecting the memory element with a reference low voltage power supply. There is provided a precharge network for the conduction terminal of the flash cell and the network incorporates a complementary pair of transistors. The second transistor of the pair is a natural N-channel MOS type. With the UPROM cell is associated a circuit portion for generating a second live output signal to be applied to the control terminal of the second transistor. The circuit portion includes a timing section and a generation section for the second live output signal.

17 Claims, 4 Drawing Sheets

UPROM CELL FOR LOW VOLTAGE SUPPLY

FIELD OF THE INVENTION

The present invention relates to UPROM memory cells for low supply voltages. Specifically but not exclusively, the present invention concerns a UPROM cell incorporating at least one EPROM or flash memory element having a control terminal and a conduction terminal to be biased, a register with inverters connected to the memory element, and MOS transistors connecting the memory element with a reference low-voltage supply.

BACKGROUND OF THE INVENTION

As known, one of the greatest difficulties encountered in providing memory devices integrated on semiconductors on a very large scale is the yield of the associated production process. It often happens that at the end of the production process the defects of the memory cell matrix are such as to make the device unusable. The cell matrix occupies the largest part of the circuit area of the device and there is high probability that a serious manufacturing defect will reside in the circuit portion occupied by the matrix.

In this context the production of non-volatile memory devices of the so-called EPROM and flash type has proven to have very low yield. The prior art has sought to remedy the low yield of the production process of flash memories. The solution thus far adopted includes equipping the cell matrix with additional rows and/or columns—termed redundant—which could be used if necessary to replace rows or columns which prove defective or display malfunctions after testing of the device.

Those skilled in the art know well the design methodologies using redundant rows and columns and the associated selection circuitry. The latter allows readdressing the memory in such a manner as to replace the addresses containing defective bits with operating ones present in the redundant rows or columns. Currently, the continuing evolution of technology and the market trend for semiconductors lead to designing memory devices capable of operating with ever lower supply voltages.

This involves several significant problems due to the fact that to obtain a memory device efficient and fast in response, in particular in the reading phase, it is necessary that the redundant cells and circuitry also meet certain stringent specifications. Specifically the UPROM memory cells incorporated in the selection circuitry which contains the binary codes of the addresses to be redundant must be able to operate effectively even with a low power supply.

The technical problem underlying the present invention is a UPROM cell having structural and functional characteristics such as to allow extremely fast reading of the memory, while being able to operate with low supply voltages. This would allow overcoming the limitations and shortcomings of the present solutions proposed by the prior art for low voltage memory devices.

SUMMARY OF THE INVENTION

The concept underlying the present invention is to precharge the drain terminal of the flash cell incorporated in the UPROM cell to prevent the problem of the presence of extra charge current for parasitic capacitors present in the UPROM cell.

On the basis of this concept the technical problem is solved by a UPROM cell in accordance with the present invention which preferably comprises: at least one memory element of the EPROM or flash type having a control terminal and a conduction terminal to be biased; a register comprising inverters connected to the at least one memory element; MOS transistors connecting the at least one memory element with a reference low voltage power supply; and a precharge network for the conduction terminal of the at least one memory element, and wherein the precharge network preferably comprises a complementary pair of first and second transistors. The first transistor of the complementary pair of transistors is preferably connected to the reference low voltage power supply and is for protection from electrostatic discharges. The second transistor of the pair of complementary transistors is preferably a natural N-channel MOS type transistor.

In addition, the cell preferably also includes a circuit portion for generating a second live output signal to be applied to a control terminal of the second transistor. This circuit portion preferably comprises a timing section and a generation section for generating the second live output signal. The timing section preferably includes a series of inverters and at least one logic gate connected thereto. The generation section may include a logic gate with two inputs and an output, and a transistor having a control terminal connected to the output of the logic gate and having conduction terminals being respectively coupled in feedback to the two inputs of the logic gate.

BRIEF DESCRIPTION OF THE DRAWINGS

The characteristics and advantages of the cell in accordance with the present invention are set forth in the description of an embodiment thereof given below by way of non-limiting example with reference to the annexed drawings.

DETAILED DESCRIPTION OF THE PREFERRED EMBODIMENTS

Figure 1:
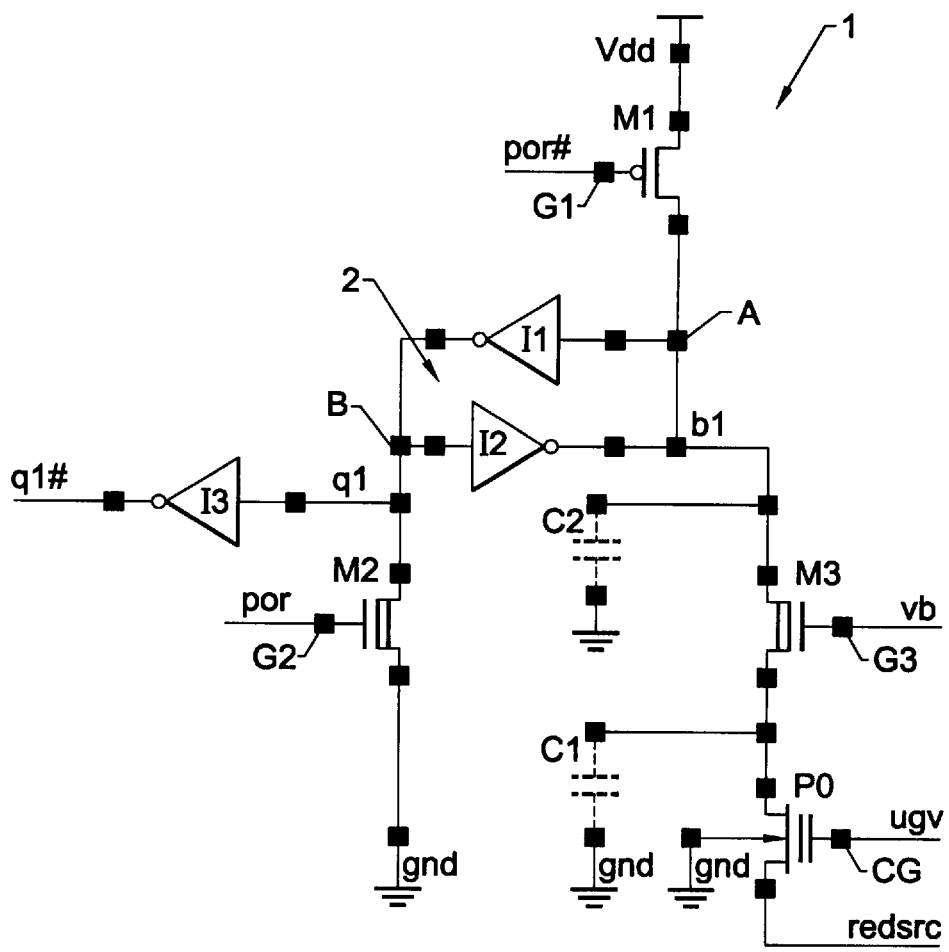
FIG. 1 shows a basic diagrammatic view of an UPROM memory cell provided in accordance with the present invention.
Figure 2:
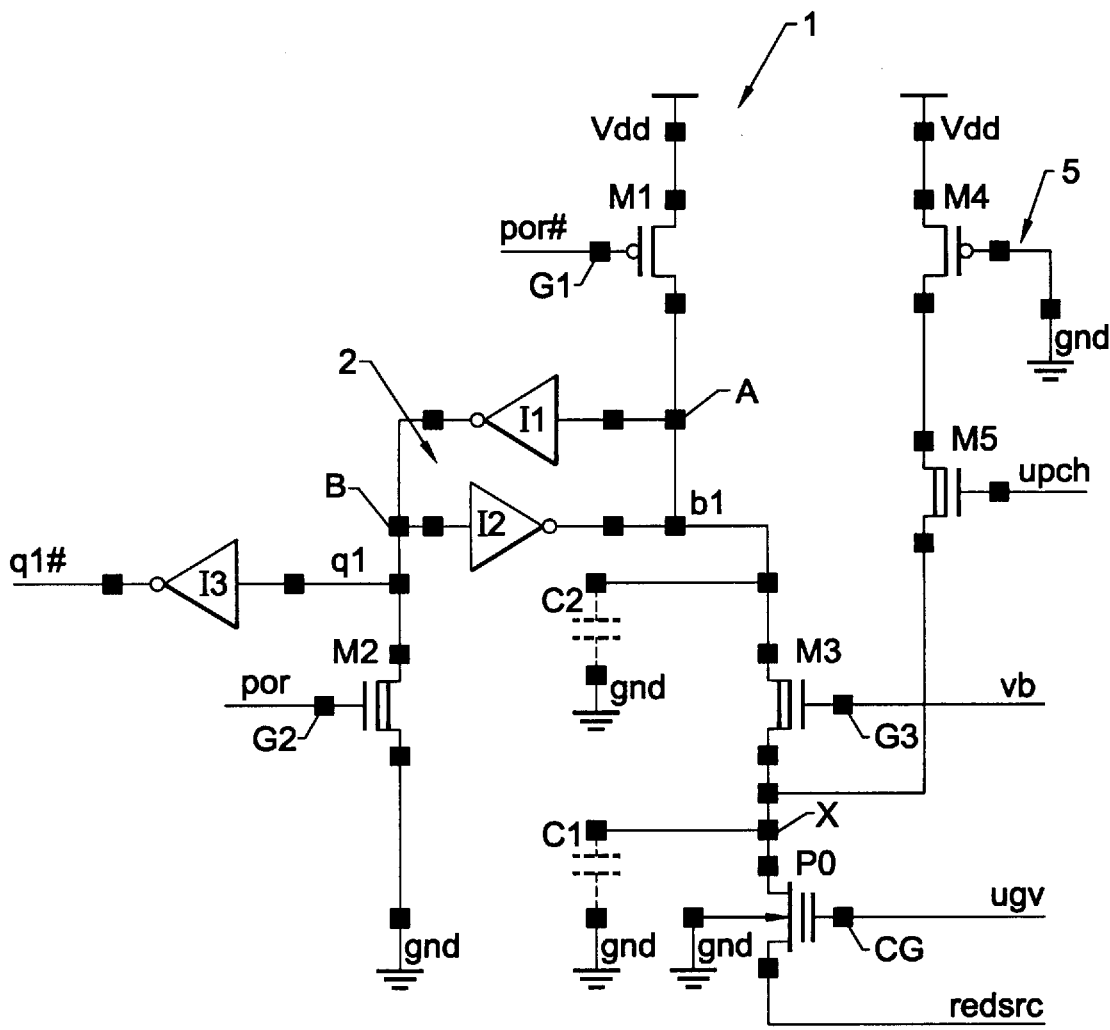
FIG. 2 shows a diagrammatic view of a preferred embodiment of the cell of FIG. 1.

With reference to the figures, reference number 1 indicates as a whole and diagrammatically the structure of an UPROM memory cell provided in accordance with the present invention. The cell 1 is integrated in a semiconductor memory device and, in particular, the EPROM or flash type operating on a low supply voltage. The memory device is not shown in the drawings but is understood to be the type comprising a cell matrix organized in rows and columns and connected to control, selection and decoding circuitry.

Figure 3:
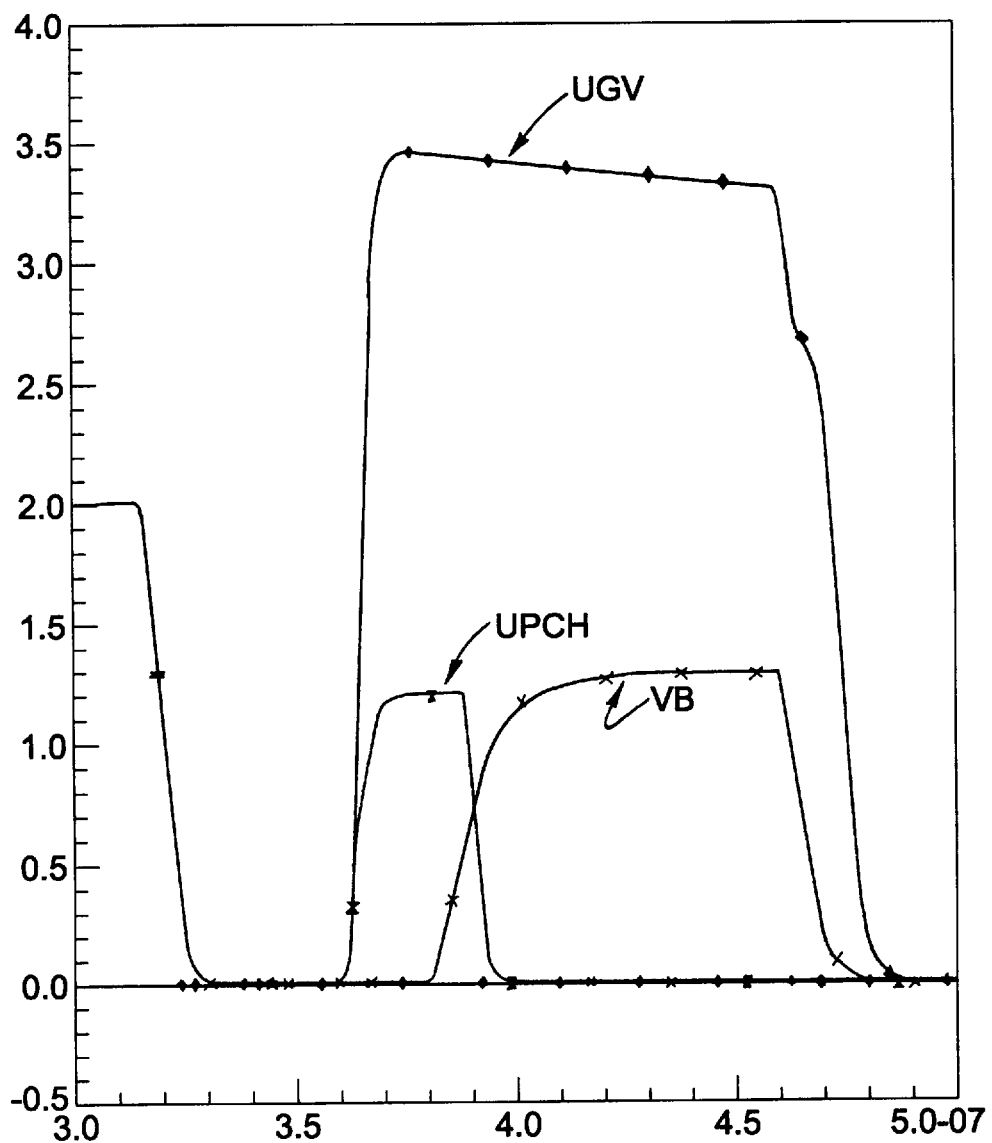
FIG. 3 shows a diagram of the behavior as a function of time of some voltages present in the cell of FIG. 1.

The cell 1 is powered by a supply voltage Vdd having a value between 2.5 V and 3.6 V and is connected between the power supply Vdd and a second reference voltage GND, for example a signal ground. This UPROM cell comprises a memory element represented by a floating gate cell P0 of the EPROM or flash type containing a binary code of an address to be redundant. This cell P0 is a floating gate transistor with its body terminal connected to ground and a control gate CG to which is applied a live signal UGV. The behavior of the signal UGV as a function of time is shown in FIG. 3.

On the source terminal of the transistor P0 is present a signal redsrc, while the other conduction terminal (drain) is connected to the power supply Vdd through a complementary pair of MOS transistors M1,M3. Respective parasitic capacitors C1 and C2 are present between the drain terminals of the transistors P0 and M3 and ground GND. The basic structure of the UPROM cell 1 also comprises a first inverter I1 and a second inverter I2 each having its respective input A and output B terminals connected to the output and input of the other inverter.

The first MOS transistor M1 of the complementary pair is the P-channel type and connects the input A of the first inverter I1 with the power supply Vdd. The second MOS transistor M3 is the natural N-channel type and connects the input A of the first inverter I1 with the drain terminal of the cell P0 in a source follower configuration.

The control terminal of the cell P0 receives the signal UGV, while to the respective control terminals G1 and G3 of the transistors M1 and M3 is applied a signal POR# and a drain voltage signal Vb. The behavior as a function of time of the signal Vb is shown in FIG. 3 while the signal POR# represents the negated form of a POR starting and initialization signal known as 'power on reset'. This POR signal is generated inside the memory device by a power on reset circuit portion. The POR signal is applied to the control terminal G2 of an enablement transistor M2 of the natural N-channel type inserted between the output B of the first inverter I1 and ground GND.

The inverters I1 and I2 make up a register of the latch type and the transistors M1 and M2 allow performance of the initialization phase of this latch. M1 and M3 allow updating of the state of the latch depending on the state of the non-volatile cell P0.

The UPROM cell 1 also comprises an output buffer I3 having its input connected at a common node B to the output of the first inverter I1 and to the input of the second inverter I2. On the node B is generated a signal q1 which downstream of the output buffer I3 becomes a negated signal q1#. There is now described operation of the UPROM cell in accordance with the present invention starting from an initial state in which the memory device is turned on.

When turned on, the power on reset circuitry portion produces a pulsed POR signal having high logical value, i.e. corresponding to a logical '1'. The signal POR#, which is the negation of the above, will consequently correspond to a logical '0'. This situation allows an initial unbalance of the latch 2 which will go into a state of rest or stand-by with the output of the first inverter I1 at a low logical value and the output of the other inverter I2 at a high logical value.

At the end of the POR pulse there are supplied to the flash cell P0 the control voltages UGV and Vb, and a reading of its information content is performed. If the flash cell P0 is canceled, i.e. if it has a threshold voltage lower than 2.5 V, it will begin to conduct when the two voltage values UGV and Vb have reached their rated value of approximately 3 V and 1.5 V respectively. At this point, the latch 2 can be unbalanced and brought into a state in which the output of the inverter I1 has high logical value, while the output of the inverter I2 has low logical value. If the flash cell P0 were written, i.e. if its threshold voltage were higher than 4 V or 5 V, it would not absorb current and therefore the latch 2 would remain in its stand-by state.

It is important to note that the sizing of the inverters I1 and I2 is especially critical and must allow for the following conditions:

the latch 2 must be unbalanced with the minimum current absorbed from a canceled flash cell P0, and the latch 2 must not modify its state during the reading of a written flash cell P0 because of the charge current of the parasitic capacitor C1. This current begins to flow as the voltage Vb increases.

The two above conditions conflict with each other because:

the first condition can be satisfied if the pull-up of the second inverter is very resistive since in this manner the presence of current in the flash cell P0 is able to lower the voltage on the node A, and the second condition can be satisfied with a more conductive pull-up so as to supply a charge current of the parasite capacitor C1 without overly disturbing the voltage on the node A.

Satisfying these two conflicting requirements is very important in the case of low voltage power supply because a decrease in the voltage also decreases the reading current of the flash cell. Advantageously in accordance with the present invention the structure described above was improved in order to supply an extra charge current for the parasite capacitor C1. All this was obtained by keeping unchanged the pull-up of the second inverter I2.

A precharge network 5 was associated with the basic structure of the UPROM cell 1. The precharge network 5 comprises a complementary pair of transistors M4 and MS. The transistor M4 is the MOS P-channel type with the gate terminal connected to ground and the source terminal connected to the power supply Vdd. The transistor MS is the natural MOS N-channel type and receives on its gate terminals a UPCH signal. The drain terminal of the transistor MS is connected to the source terminal of the transistor M4. The source terminal of the transistor MS is connected to a node X which coincides with the drain terminal of the transistor P0, and, hence, of the flash cell. The presence of the transistor M4 is useful only for the purpose of protecting the natural transistor MS from electrostatic discharges.

Advantageously the signal UPCH applied to the gate terminal of the transistor M4 allows performance of a precharge of the drain terminal X of the flash cell. FIG. 3 shows the behavior of the signal UPCH as a function of time. It is readily understood that first the value of the voltage UGV on the control gate of the flash cell is set and then the precharge pulse UPCH on the transistor MS is set. The reading pulse given by the signal Vb arrives only subsequently. To avoid undesired stress on the flash cell the value of the precharge pulse has a controlled amplitude equal to that of the signal Vb.

Figure 4:
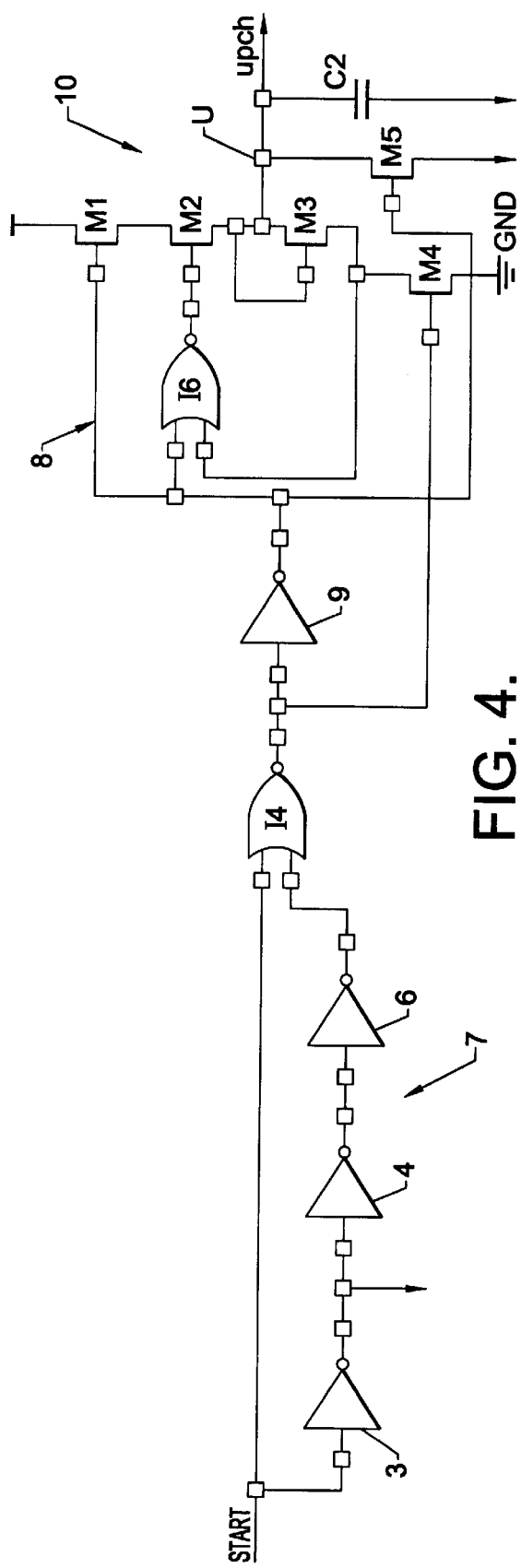
FIG. 4 shows a diagrammatic view of a voltage generator associated with the UPROM memory cell in accordance with the present invention.

FIG. 4 shows diagrammatically the structure of a generator circuit 10 for the precharge pulse UPCH. The circuit portion 10 comprises basically two sections, one 7 for timing and the other 8 for generation of the UPCH voltage. The timing section 7 controls the time of intervention of the remaining generation section as clarified in the description below. The section 7 has an input terminal I which receives a signal START for enablement of generation of the signal UPCH.

The signal START is supplied by circuitry assigned to generation of the signal UGV for the control gate of the flash cell. This circuitry is not described in detail since it is the subject of a correlated patent application of this same assignee. The section 7 comprises a logical gate I4 of the NOR type having a first input directly connected to the input I. The other input of the gate I4 is connected downstream of a series of inverters 3, 4 and 6. The input of the first inverter 3 coincides virtually with the input I. A capacitor C1 is inserted between the input of the second inverter 4 and ground GND. A fourth inverter 9 connects the section 7 with the section 8 downstream of the logical gate I4. The generation section 8 comprises a logic gate I6 of the NOR type equipped with a feedback loop.

The output of the logic gate I6 of the section 8 is connected to the control terminal of a natural N-channel transistor M2 having one conduction terminal connected to the power supply through a transistor M1, and the other conduction terminal connected to ground through a transistor M3 in a diode configuration and connected, in turn, to another transistor M4.

The control terminal of the transistor M1 is connected to a first input of the gate I6, while the connection node between threshold transistors M3 and M4 is connected in feedback to the other input of the gate I6. The control terminal of the transistor M4 is directly connected to the output of the logical gate I4 of the first section 7.

Between threshold transistors M2 and M3 there is an output node U on which is taken the output voltage UPCH. This output node U is connected to ground through a transistor M5. A capacitor C2 indicates the presence of a parasitic capacitor of the line UPCH. The control terminal of the transistor M5 is connected to the first input of the logical gate I6.

There is now discussed operation of the circuit portion 10. When the gate I6 has one of its inputs at high logical value, its output will consequently be at low logical value and will keep the transistor M2 off. Under these conditions the transistor M5 is on and holds the output node U at the value of ground.

When the input I rises to high value the output of the gate I6 is allowed to switch in turn to the value '1'. In this manner the transistor M2 is turned on allowing passage of current through the transistors M1, M3, M4. The voltage on the output UPCH can reach the rated operation value set by the release threshold of the gate I6 and by the threshold voltage of the transistor M3.

If the voltage UPCH had a value lower than that indicated, the output of the gate I6 would allow the transistor M2 to conduct more current, and, thus, increase the output voltage. But if the voltage UPCH were higher than the selected value, the fedback input of the gate I6 would assume a potential value higher than the release threshold of the gate to take the output to a low potential and extinguish the transistor M2. In this manner UPCH would be reduced until it reached the predetermined value.

The feedback loop formed by the logical gate I6 and the transistors M2 and M3 has two great advantages, including:
- the output voltage UPCH is kept equal to the release threshold of the logical gate I6 and of a natural N-channel transistor M3. The threshold of the latter component is equal to approximately 0.5 V; the value of UPCH is kept steady even in case of power supply Vdd affected by an electrostatic discharge, and
- the charge transient of the parasitic capacitor on the output line UPCH is very fast, less than 10 ns, just because of the feedback of the loop.

The UPROM cell in accordance with the present invention has the significant advantage of being especially sensitive, and, is thus suited to operation with low supply voltages. These characteristics are made possible with a negligible increase in the circuit area occupied. Variations and modifications can be made to the UPROM cell of the present invention within the scope defined by the following claims.

We claim:

1. A UPROM cell comprising:
   at least one memory element of the EPROM or flash type having a control terminal and a conduction terminal to be biased;
   a register comprising inverters connected to said at least one memory element;
   MOS transistors connecting said at least one memory element with a reference low voltage power supply;
   a precharge network for the conduction terminal of said at least one memory element, said precharge network comprising a complementary pair of first and second transistors, and means connecting at least one of first and second transistors to the reference low voltage power supply for protecting against electrostatic discharge.

2. A cell in accordance with claim 1 wherein the first transistor of said complementary pair of transistors is connected to the reference low voltage power supply and is for protection from electrostatic discharges.

3. A cell in accordance with claim 1 wherein the second transistor of said pair of complementary transistors is a natural N-channel MOS type transistor.

4. A cell in accordance with claim 3 further comprising a circuit portion for generating a second live output signal to be applied to a control terminal of said second transistor, and wherein said circuit portion comprises a timing section and a generation section for generating the second live output signal.

5. A cell in accordance with claim 4 wherein said timing section comprises a series of inverters and at least one logic gate connected thereto.

6. A cell in accordance with claim 4 wherein said generation section comprises a logic gate with two inputs and an output, and a transistor having a control terminal connected to the output of said logic gate and having conduction terminals being respectively coupled in feedback to the two inputs of the logic gate.

7. A cell in accordance with claim 1 wherein the first transistor of said complementary pair of transistors is a P-channel MOS type transistor with a control terminal connected to ground.

8. A cell in accordance with claim 1 wherein said MOS transistors connecting said memory element with the reference low voltage power supply are a complementary pair including a natural N-channel MOS type transistor.

9. A cell in accordance with claim 3 wherein a source terminal of said natural N-channel MOS type transistor is directly connected to the conduction terminal of said at least one memory element.

10. A UPROM cell comprising:
    at least one memory element of the EPROM or flash type having a control terminal and a conduction terminal to be biased;
    MOS transistors connecting said at least one memory element with a reference low voltage power supply; and
    a precharge network for the conduction terminal of said at least one memory element, said precharge network comprising a complementary pair of first and second transistors, the first transistor of said complementary pair of transistors being connected to the reference low voltage power supply to protect against electrostatic discharges.

11. A cell in accordance with claim 10 wherein the second transistor of said pair of complementary transistors is a natural N-channel MOS type transistor.

12. A cell in accordance with claim 11 further comprising a circuit portion for generating a second live output signal to be applied to a control terminal of said second transistor, and wherein said circuit portion comprises a timing section and a generation section for generating the second live output signal.

13. A cell in accordance with claim 12 wherein said timing section comprises a series of inverters and at least one logic gate connected thereto.

14. A cell in accordance with claim 12 wherein said generation section comprises a logic gate with two inputs and an output, and a transistor having a control terminal connected to the output of said logic gate and having conduction terminals being respectively coupled in feedback to the two inputs of the logic gate.

15. A cell in accordance with claim 10 wherein the first transistor of said complementary pair of transistors is a P-channel MOS type transistor with a control terminal connected to ground.

16. A cell in accordance with claim 10 wherein said MOS transistors connecting said memory element with the reference low voltage power supply are a complementary pair including a natural N-channel MOS type transistor.

17. A cell in accordance with claim 11 wherein a source terminal of said natural N-channel MOS type transistor is directly connected to the conduction terminal of said memory element.

* * * * *

UNITED STATES PATENT AND TRADEMARK OFFICE
CERTIFICATE OF CORRECTION

PATENT NO. : 5,822,259
DATED : October 13, 1998
INVENTOR(S) : Maccarrone et al

It is certified that error appears in the above-identified patent and that said Letters Patent is hereby corrected as shown below:

On the title page: Item [75] Inventors: should read --

Marco Maccarrone, Palestro; Stefano Ghezzi, Treviolo; Maurizio Branchetti, San Polo D'enza, all of Italy --.

Item [73] should read --
SGS-Thomson Microelectronics S.r.l., Agrate Brianza, Milano, Italy --.

Signed and Sealed this

Second Day of March, 1999

Attest:

Q. TODD DICKINSON

*Attesting Officer*    *Acting Commissioner of Patents and Trademarks*